United States Patent [19]

McFadyen

[11] 4,050,029

[45] Sept. 20, 1977

[54] ELECTRONIC APPARATUS COMPRISING AN AUDIO AMPLIFIER PROVIDING SHUNT VOLTAGE REGULATION

[75] Inventor: Robert J. McFadyen, Syracuse, N.Y.

[73] Assignee: General Electric Company, Syracuse, N.Y.

[21] Appl. No.: 702,287

[22] Filed: July 2, 1976

[51] Int. Cl.² .............................................. H03F 3/04
[52] U.S. Cl. ...................................... 330/22; 330/17; 330/18; 330/19; 330/40
[58] Field of Search ...................... 330/15, 17, 18, 19, 330/22, 40

[56] References Cited

U.S. PATENT DOCUMENTS

| | | | |
|---|---|---|---|
| 3,870,965 | 3/1975 | Frederiksen | 330/19 X |
| 3,914,703 | 10/1975 | Stauffer | 330/17 |
| 3,938,053 | 2/1976 | Menniti et al. | 330/22 X |

Primary Examiner—Rudolph V. Rolinec
Assistant Examiner—Lawrence J. Dahl
Attorney, Agent, or Firm—Richard V. Lang; Carl W. Baker; Frank R. Neuhauser

[57] ABSTRACT

Electronic apparatus is disclosed suitable for integrated circuit fabrication and comprising shunt voltage regulation. The electronic apparatus may be a radio receiver which uses an unregulated current source for its supply voltage. The power amplifier of the audio amplifier has a pair of conventional large area push-pull output transistors which are connected in shunt with the supply. In accordance with the invention, shunt voltage regulation of the supply voltage is achieved by sensing a change in the supply voltage using a zener diode for a voltage reference and then altering the idling current in the output transistors in response to changes in current flow through the zener diode. In consequence of increases in idling current, the output stages shift from class B toward class A operation and shunt regulate the supply voltage. The zener diode is arranged to provide both stabilization of the full supply voltage and the centering voltage of the push-pull output amplifier.

6 Claims, 3 Drawing Figures

IC REGULATION PROFILE

ELECTRONIC APPARATUS COMPRISING AN AUDIO AMPLIFIER PROVIDING SHUNT VOLTAGE REGULATION

The audio amplifier itself is the subject of the copending application of William Peil, Ser. No. 590,767, filed June 26, 1975, which application is itself a continuation-in-part of application Ser. No. 435,450 filed Jan. 22, 1974.

BACKGROUND OF THE INVENTION

1. Field of the Invention

The present invention relates to electronic apparatus, typically solid state radio receivers, wherein means have been provided for reducing the costs of supplying low voltage power from higher voltage a.c. mains. The invention also relates to regulated power supplies. The techniques disclosed are suitable for use with integrated circuits (IC) apparatus.

2. Description of the Prior Art

Power supplies for solid state receivers tend toward simple low cost configurations. A typical configuration is a half wave rectifier operating through a voltage dropping resistance, and including a single large filter capacitor at the output terminal of the rectifier. If the single section filter has too great a "hum" component, a second RC section may be provided. If the series resistance used to reduce the voltage from a typical value of 110 volts to 12 volts occasions too large a fluctuation in the output voltage under normal manufacturing variations and ambient conditions, then a transformer supply, which is of higher cost, or voltage regulator may be necessary. The need for voltage regulation is normally set by the tolerance of the equipment to increases in supply voltage. If the equipment uses large valued, low voltage capacitors, then there is a cost trade-off between increasing the voltage rating of the capacitor to preclude failure from over voltage versus adding a voltage regulation feature. The integrated circuit process also sets an upper limit to the tolerable supply limits. IC processors are frequently defined as 14 volt, 16 volt, 20 volt, 25 volt, etc. processes. The higher the voltage, the more costly they are, so the tendency is to reduce the processes to the lower voltage ranges consistent with circuit performance. The advent of integrated circuitry has made it practical to add active elements to a configuration with only the modest incremental costs of additional chip area. Since zener voltage reference devices and large area transistors can both be integrated, adding one internal regulator now becomes an alternative to the other measures noted above.

SUMMARY OF THE INVENTION

Accordingly, it is an object of the present invention to provide a solid state electronic apparatus having an improved power supply.

It is a further object of the present invention to provide an integrated circuit electronic apparatus having an improved voltage regulated power supply.

It is an additional object of the present invention to provide an integrated audio amplifier having an economic voltage regulated power supply.

It is still another object of the present invention to provide in an integrated circuit electronic apparatus having a push-pull audio output stage, a low cost power supply providing a regulated bias voltage and regulated centering voltage for the amplifier.

These and other objects of the invention are achieved in an electronic apparatus comprising a source of bias potentials having appreciable internal resistance and thus requiring voltage regulation, a push-pull audio output stage, a driver stage for the push-pull output stage and voltage regulating means. The source of bias potential typically takes the form of a voltage dropping resistance, having a value selected to reduce the voltage from the higher values available at the a.c. mains to a lower voltage suitable for solid state operation, a diode for half wave rectification, and a capacitor for reducing a.c. ripple.

The push-pull audio output stage comprises a first and a second output transistor of a first conductivity type, each output transistor being connected in a base input configuration with the collector of the first being connected to the non-common terminal of the source, the emitter of the first being coupled to the collector of the second and the emitter of the second being returned to the common terminal. The audio output is derived at the output transistor interconnection. The output transistors are dimensioned to have sufficient current carrying capacity for shunt regulation of the source.

The driver stage comprises a third transistor of the first conductivity type for driving both output transistors. It is connected in base input, emitter follower configuration, with its emitter being d.c. coupled to the base of the second output transistor. The intermediate driver comprises a fourth transistor of the first conductivity type having its base d.c. coupled to the emitter of the third transistor through a first resistance and its emitter common to parallel the input junctions of said fourth and second transistors to stabilize their current ratios.

In accordance with another aspect of the invention a constant current source is provided having its input coupled to the non-common terminal and its output coupled to the base of the first output transistor for control of its idling current. In addition, the intermediate driver further comprises a fifth transistor of a second conductivity type, having its collector coupled to the output interconnection, its base electrode coupled to the collector of the fourth transistor and its emitter coupled to the output of the constant current source. This configuration causes the idling current of the first output transistor and the fifth transistor to equal the idling current to the second output transistor.

The voltage regulating means comprises a voltage reference, typically a zener diode, for sensing a deviation in bias potential from the desired value, and means for producing an error current responsive to the potential deviation. In the practical embodiment, the current flowing in the zener diode is sensed and used to cause a corresponding current to flow through the first resistance (or a portion thereof) to cause a change in base-emitter potential in the second transistor. The change in base-emitter potential alters the current ratio between the second and fourth transistor and produces an absolute change in the idling current of the second output transistor. By virtue of the interconnection to the first and fifth transistors, a corresponding change in idling current is also produced in the first output transistor. These changes in idling current take place in a sense to achieve shunt regulation of the power supply voltage.

In accordance with a further aspect of the invention, the d.c. idling voltage at the output transistor interconnection is stabilized by means including a second resistance having one end coupled to the base electrode of the third transistor and the other end coupled to the output transistor interconnection. The potential of the output transistor interconnection is controlled by means including a controlled current source adjusted to withdraw sufficient current from the second resistance to hold the output idling voltage at approximately half the bias voltage.

In accordance with an additional aspect of the invention, the zener reference is provided with a series impedance, typically a forward biased diode. The two are serially connected across the bias source to sense the potential, the current in the zener diode increasing when the zener voltage is exceeded. In order to accurately sense the zener diode current, a sixth transistor is provided having its input shunting the series impedance and its collector connected to the first resistance to supply current thereto.

Preferably, the transistors and zener diodes are integrated in a common monolithic substrate.

BRIEF DESCRIPTION OF THE DRAWING

The novel and distinctive features of the invention are set forth in the claims appended to the present application. The invention itself, however, together with further objects and advantages thereof may best be understood by reference to the following description and accompanying drawings in which:

DESCRIPTION OF THE PREFERRED EMBODIMENT

Figure 1:
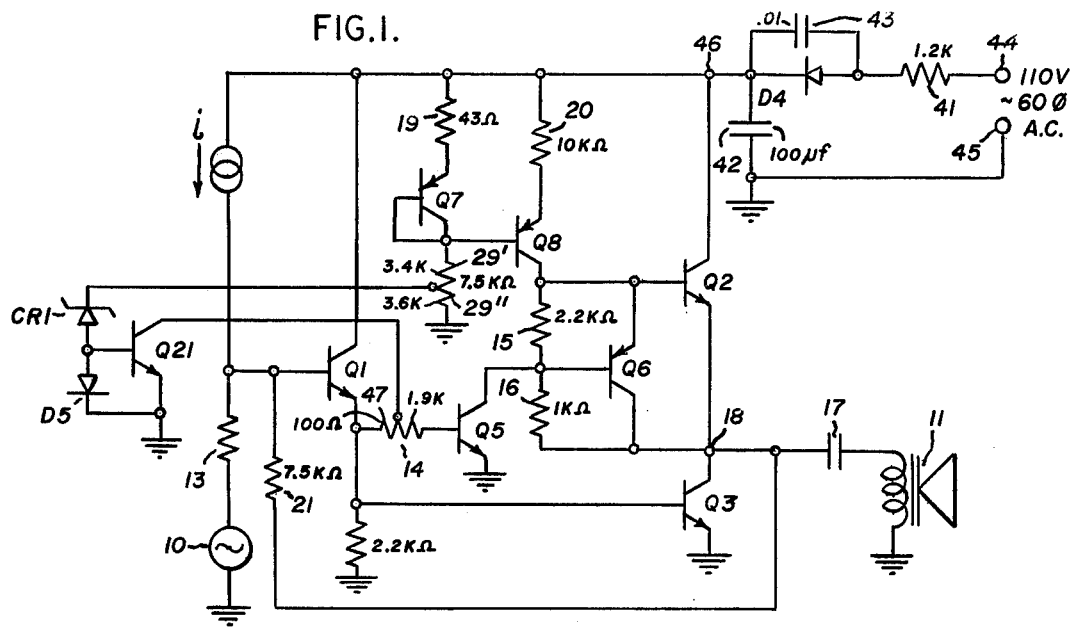
FIG. 1 is a simplified circuit diagram of an audio amplifier for use in a radio receiver and a simple current source bias supply, in which the output stages of the included audio amplifier are utilized to produce shunt regulation of the bias voltage.

As previously noted, FIG. 1 illustrates the audio amplifier and power supply portions of a radio receiver which is of largely integrated construction. The power supply, which takes the form of a line voltage dropping resistance, a half wave rectifier and a filter capacitor is shown together with an audio amplifier which is utilized to regulate the output voltage of the power supply.

The audio amplifier has as its principal components an emitter follower driver employing an NPN transistor Q1 to which medium level audio signals are applied from audio signal source 10; a push-pull power amplifier employing NPN transistors Q2, Q3, normally operating class B, the latter (Q3) being driven directly by Q1, and the former (Q2) being driven through cascaded first and second transistors Q5 and Q6, of NPN and PNP conductivity types, respectively; a constant current source comprising the transistors Q7, Q8; an a.c. coupled loudspeaker 11 forming the audio load for the push-pull amplifier; and a power supply providing d.c. bias potentials comprising half wave rectifier D4 and elements 41 to 46.

An audio signal from source 10 is coupled to the base of NPN driver transistor Q1 which drives both NPN push-pull output stages (Q1, Q3). Transistor Q1 is in an emitter-follower configuration with its collector connected to the positive terminal 46 of the bias supply, and its emitter directly connected to the base of the lower push-pull output transistor Q3 for supplying a noninverted driving signal to it. The emitter of Q1 is coupled to the common supply terminal (ground) through load resistance 13.

The upper push-pull output transistor Q2 is driven by emitter follower Q1 through two intermediate stages employing Q5 and Q6. The emitter of NPN transistor Q1 is coupled through tapped resistance 14 to the base of NPN transistor Q5. Transistor Q5 is in the common emitter configuration, is normally biased for class "B" operation, and produces an inverted output signal at it collector. That output signal is coupled to the base of PNP transistor Q6. Serially connected resistances 15 and 16, respectively, shunt the input and output junction of Q6. The emitter of Q6 is coupled to the collector of the transistor Q8 (from which a constant current is derived) and to the base of Q2. The PNP transistor Q6 may be regarded as in an emitter follower configuration, coupling the inverted input signal applied to its base via its emitter to the base of Q2.

The push-pull output stage comprises the pair of NPN power transistors Q2, Q3, coupled in series between B+ and ground, and having the loudspeaker load coupled to their mid-point. The input biasing conditions provide for class A operation of the output stages in the voltage range at which shunt regulation occurs. The collector of Q2 is connected to the positive terminal 46 and the emitter of Q2 is coupled to the collector of the lower push-pull transistor Q3. The emitter of Q3 is connected to the grounded terminal 45 of the bias supply. The connection of the emitter of Q2 to the collector of Q3 becomes the terminal (18) for the push-pull amplifier load. The amplifier load comprises the loudspeaker 11 having one terminal connected to ground and the other terminal coupled through capacitor 17 to the amplifier output terminal 18. Finally, a degenerative audio signal feedback connection introduced both for signal linearity and stability is provided from the amplifier output terminal 18 through resistance 21 to the base of driver transistor Q1.

The input biasing conditions for the amplifier are established by the constant current source Q8, the sundry circuit connections noted, and certain constructional features to be elaborated on below.

The constant current source has an internal current reference and a controlled source of current. The current reference comprises the diode connected PNP transistor Q7, having its emitter coupled through resistance 19 (43 ohms) to output terminal 46 of the positive bias source 12, its base and collector interconnected and led serially through tapped resistance 29 (7.5K ohms) to ground. The controlled source of current comprises PNP transistor Q8, having its emitter coupled through resistance 20 to the positive source 12, its base coupled to the collector-base connection of Q7, and the collector of Q8, from which the constant current is derived, connected to the common connection of resistance 15, the emitter of Q6, and the base of Q2. The geometry of Q7 and Q8 are carefully controlled so that Q8 maintains current at a substantially fixed multiple of the current in reference Q7.

The amplifier so far described provides both low distortion, high stability and a substantial power output in an integrated circuit format. In the matter of signal amplification, the amplifier has suitable gain for operation with a pre-amplified signal from an AM-FM detector, and to produce adequate audio power to drive a conventional loudspeaker for home use. When operated with the indicated B+ supply, the undistorted power output lies in the range of from 150-250 milliwatts.

The power supply for the radio receiver is of a simple, minimum cost design and its output voltage is shunt regulated by the audio output stages Q2 and Q3 in a manner now to be described. The power supply 12 for the radio receiver is designed to convert conventional 110 volt, 60 cycle a.c. to a regulated d.c. output voltage of typically 13.5 volts at 42 milliamperes. The power supply consists of a voltage dropping resistor 41 connected between the a.c. input terminal 44 and the anode rectifier D4. The cathode of diode D4 is connected to the output terminal 46 of the d.c. supply. The second a.c. input terminal 45 is connected to the receiver ground. The voltage dropping resistor 41 and rectifier D4 produce a reduced voltage consisting of alternate half cycles of the input waveform. The pulsating unidirectional output is filtered by a large (>100µf) capacitor 42 connected between the positive d.c. output terminal 46 and ground. The capacitor 43 is used to reduce radio frequency interference. The audio output stages Q2 and Q3 shunt the output terminals of the d.c. supply and thus are disposed for shunt regulation of the d.c. output voltage.

The remainder of the power supply circuit and in particular the elements completing the voltage regulation function, include the zener diode CR1, diode D5 and transistor Q21. The zener which is used to sense a deviation of potential at the d.c. source has its cathode coupled to a tap on resistance 29, and its anode coupled to the anode of diode D5 whose cathode is grounded. The diode D5 shunts the input junction of transistor 21, and is poled in the same direction. The collector of transistor Q21 is coupled to a tap on resistor 14, and as will be seen supplies a current to that resistance, which controls the idling current of both output transistors Q2 and Q3. The resistance 29 shunts the d.c. supply and the zener connected tap is set at, or slightly in excess of, the zener voltage when the d.c. supply is at the correct setting.

D.C. voltage regulation is produced by sensing the d.c. output voltage and increasing or decreasing the conduction in output transistors Q2, Q3. When the desired d.c. bias voltage is exceeded, the zener diode CR1 conducts more heavily and injects the increased current through diode D5 to ground. The transistor Q21, whose input junction parallels D5 so as to force its input junction voltages to equality with that of the diode, conducts current proportional to that of the diode that proportion is defined by the relative junction areas of the two devices. Since the area ratios of Q21 to D5 may be closely controlled, they maintain the accuracy of the zener voltage reference in the regulation process. The current flowing in Q21, which reflects by a typically 1 to 1 ratio the zener current passing into the diode D5, flows out of the tap on resistor 14, and into the terminal on resistance 14 tied to the emitter of Q1 and base of Q3. The immediate effect of the current flow is to cause a voltage drop in the portion (47) of the resistance through which the current flows. Since the remote end of resistance 14 is coupled through the base emitter junction of Q5 to ground, the remote end tends to remain at a fixed potential as small changes in voltage occur in the portion (47) of the resistance 14 above the tap. The increased voltage therefore appears at the emitter of Q1 and the base of Q3. The effect on Q1 and its input circuitry is negligible. The idling current in Q3 on the other hand is strongly affected by any elevation in input junction potential. Thus, the current relationship between Q5 and Q3 whose input junctions are paralleled save for the voltage drop across resistance 14, changes, and the collector current in Q3 increases as an exponential relationship of that change in voltage. Increased collector current in Q3 demands more current at the emitter of the upper stage Q2. Constant current source (Q7, Q8) supplies the demanded base current for Q2 reducing slightly the current in Q5, and Q2's idling current increases in substantially the same amount as Q3.

Figure 3:
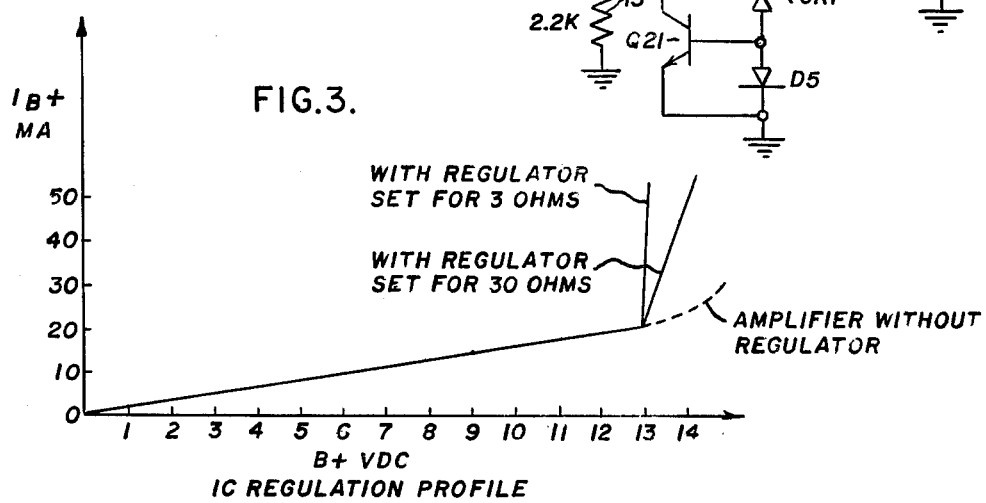
FIG. 3 is a graph of the bias voltage stabilization achieved.

The push-pull output stages Q2 and Q3 thus provide shunt regulation. Any sensed increase in supply voltage produces an increase in zener current which is used to increase the idling current of the output stages. A decrease in supply voltage has an opposite affect. Assuming an increase, the increased idling current produces an increase in total current demanded of the d.c. supply, and produces an increased voltage drop in the 1.2K series resistor. FIG. 3 illustrates the regulation profile at the design settings. Without regulation, and assuming a suitable perturbation, the B+ tends to increase at what corresponds to an internal resistance of about 100 ohms unit at about 14 volts, which is desired maximum voltage for the filter capacitor and through 20 volts which may be a desired maximum for the I.C. process employed. With the regulator in operation, and assuming a similar perturbation, the effective slope is 30 ohms with the tap portion 47 set at 100 ohms (and remainder 1.9Kohms). Under normal conditions, this holds the output voltage to less than a volt variation in the region of zener control. If the entire resistance 14 is used, the effective slope is reduced to 3 ohms. which holds the voltage variation down to 1/10 volt throughout the zener control region under normal conditions. The 30 ohms setting is normally adequate.

Figure 2:
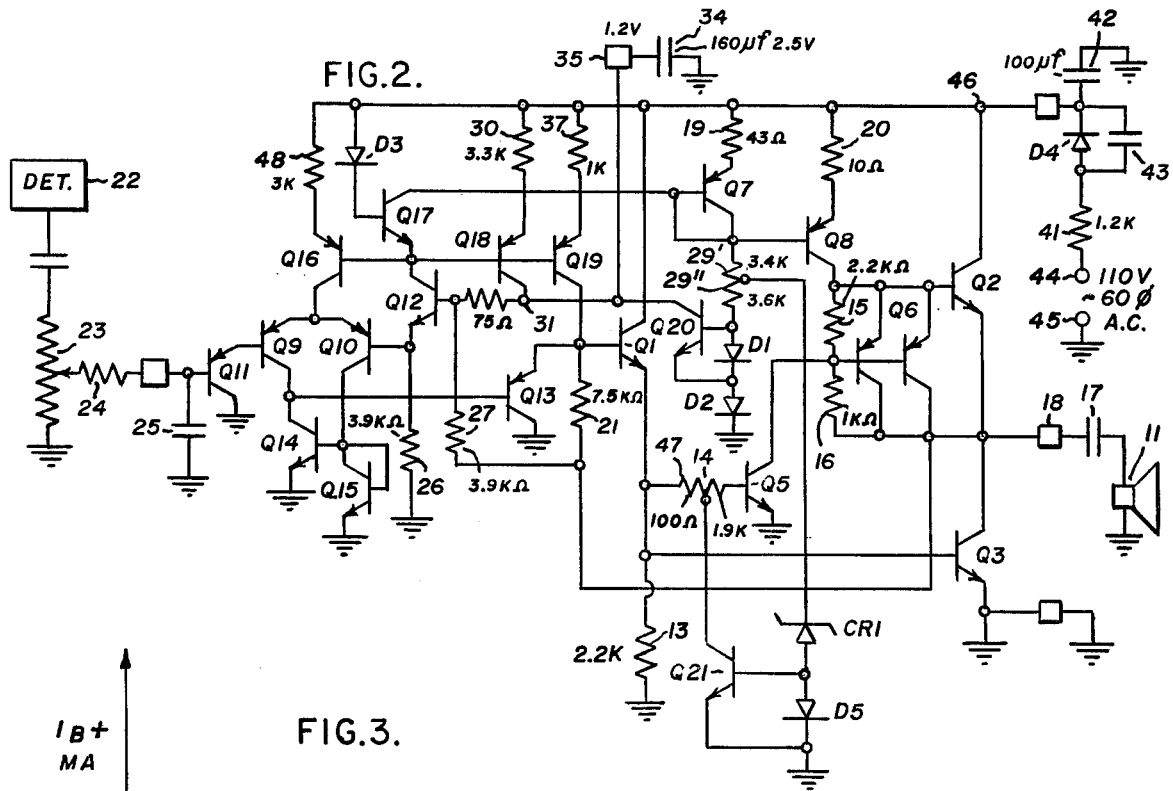
FIG. 2 is a more detailed illustration of a similar combination in which both the bias voltage and centering of the output stages are stabilized.

The amplifiers illustrated in FIG. 1 and in FIG. 2 are not in themselves the subject of the present invention. The amplifiers are the subject of a separate co-pending application, Ser. No. 590,767, filed June 26, 1975, entitled "Audio Amplifier for Integrated Circuit Fabrication Having Controlled Idling Current".

The amplifiers described in said patent application have good phase response and stability. In both, amplitude distortion and instability are controlled by the provision of a first feedback path involving resistance 21 connected between the audio output connection point 18 and the base input of the driver Q1. The feedback connection is degenerative in phase and substantially reduces any amplitude asymmetry in the waveform. Measured distortions are reduced to a few per cent.

The circuit configuration of FIG. 1 makes the idling current setting of the push-pull output stage dependent on three principal factors which can be carefully controlled during integrated circuit processing. These factors are in the current setting of the constant current source Q8, the ratio of currents between transistors Q3 and Q5; and the beta of transistor Q6. These factors are dependent on the areas of the active circuit devices. In normal processing and depending on size, these areas can be controlled to accuracies of a per cent or less.

The constant current source PNP transistor Q8 provides a stable current setting, deriving its current reference from transistor Q7. Transistor Q7 is a laterally deposited PNP transistor, diode connected, with the emitter separate and the collector and base joined. The junction of Q7 carefully replicates the junction of the controlled current source Q8 in proportion to the relative areas of the active regions. Q8 is also laterally deposited. While Q7 is formed of two "disks", Q8 is formed of 18 "disks". This produces a relative ratio of areas between the two transistors of 9 to 1 but in practice the actual current ratios are slightly less, being approximately 8 to 1.

The circuit configuration, in that both input junctions are electrically paralleled, forces the currents into a proportional relationship. Thus, the emitter of Q8 is led through a low valued resistance 20 (10 ohms) to the positive bias source, while the emitter of Q7 is led to the same source through a low valued resistance 19 (43 ohms), thus holding the emitters at nearly the same voltage. Since the bases of both transistors are joined, the Veb's of both input junctions are equalized.

The parallel circuit connection thus forces any current flowing in Q7 to be replicated in Q8 in substantial proportion to the relative areas of Q7 and Q8. The current of Q7, which is the primary reference, is dependent upon the bias voltage and series resistance 29. The value of resistance 29 establishes the reference current in Q7. Assuming fixed bias voltages, the current of constant current source Q8 is thus primarily dependent upon the current in Q7, and the relative areas of the two devices. These areas are controllable to a few percent.

The current ratio between transistors Q3 and Q5 may be maintained at a constant value by a similar control of the areas of the respective devices. Transistors Q3 and Q5 are NPN transistors. (Assuming that the substrate is selected for NPN processing, they are not laterally developed.) The circuit configuration parallels the input junctions of Q3 and Q5 and forces their Veb's into substantial correspondence. The emitters of both transistors Q3 and Q5 are grounded while their bases are interconnected by the tapped 2000 ohms resistance 14. This resistance is small in terms of base current, allowing the bases of the two transistors, and thereby both input junctions to have substantially equal potentials. With the Veb's equalized, the current ratio between Q5 and Q3 then becomes a function of the relative areas of their respective electrode regions. Typically, the area of transistors Q5 is arranged to be one-fifth that of the area of Q3 so as to fix the current ratio at approximately this same value. When current flows into the tap on resistance 14 from Q21 in the process of voltage regulation, the current ratio changes as the current in Q3 is increased sharply in respect to current in Q5.

A further element in establishing the idle current setting of the push-pull amplifier is the beta of transistor Q6. Transistor Q6 is laterally developed PNP transistor having a reduced area in relation to its operating current level so that it operates well off the beta peak of the transistor. At a 5 milliampere operating point, the beta is adjusted from a B peak of about 30 to approximately 4. Assuming the foregoing current levels, one should employ a transistor whose beta begins to fall off about one-half milliampere.

The circuit configuration and circuit values are accordingly chosen to cause transistor operation in the current region were the beta tends to stabilize. When this occurs, the beta assumes an arbitrary number, substantially independent of all factors, save for the area of the device.

The circuit connections involving Q6, Q2, Q8 complete the network which determines the idling current settings of the amplifier. The emitter of PNP transistor Q6 is coupled to the base of NPN transistor Q2 and the base of transistor Q6 is connected through resistance 16 (1000 ohms) to the emitter of Q2. By virtue of the substantial equality in the Veb's of Q6 and Q2, the potential at the base of Q6 is substantially equal to the potential at the emitter of Q2. Thus, the voltage across resistance 16 is small and the current therein negligibly small. The circuit configuration and values thus establish the division in current supplied from the collector of Q5 between resistance 16 and the base of Q6.

The final circuit factor in determining the idling current of the output stages of the amplifier is the connection of the emitter of transistor Q2, the collector of Q6 and the collector of Q3 to the output point 18. By this connection, and equality is forced between the collector current into Q3 and the current out of Q6 and Q2. Assuming Q3 to be at 6 milliamperes, Q6 at 4.8 milliamperes, then only 1.2 milliamperes of current is available at the emitter of Q2. With maximum voltage regulation action, the current levels may increase 30 milliamperes.

The configuration of FIG. 1 represents a simplified embodiment that may be readily refined to achieve excellent overall performance. The FIG. 1 version has high stability and an amplitude distortion of a few per cent. The distortion FIGURE is adequate for many applications but can readily be improved by additional feedback. The d.c. voltage balance of the amplifier at crossover is approximately fixed by the idling current provisions just described. Since the d.c. balance at 18 is defined by what may be regarded as two series connected constant current sources (Q7, Q8 and emitter follower Q3), the d.c. output voltage is indeterminate to a degree. Accordingly, if one wishes to constrain the quiescent point of the amplifier to a fixed value, or bound the a.c. swings, or to further reduce the distortion, a second feedback loop, and certain other features may be incorporated into the design. These will now be described.

In the embodiment of FIG. 2, a full audio amplifier is shown, including pre-amplification of the audio signal and a power amplifier similar to that in FIG. 1, but having a second feedback loop. Elements in the power amplifier repeated from FIG. 1, bear the same reference numerals in FIG. 2. The pre-amplifier has as its components a differential amplifier comprising PNP transistors Q9, Q10, associated PNP and NPN driving transistors Q11, Q12, a single PNP output transistor Q13; current "turn around" transistors Q14, Q15, and transistors Q16 through Q20; diodes D1 through D3; and sundry resistances which enter into the biasing provisions for the pre-amplifier and the power amplifier. In accordance with the present invention, the shunt regulation network, and in particular the sensor zener diode CR1, may be arranged in the circuit to stabilize the centering point of the push-pull output stage and to reduce the hum at low signal levels.

The amplifier of FIG. 2 amplifies an input signal as follows: As shown in FIG. 1, the input source for the amplifier is a detector 22. Typically, it is an FM or an AM detector or a detector combining both modes of detection. The detector 22 is coupled through a capacitor to a volume control potentiometer 23. One terminal of the potentiometer is grounded and audio signals from the tap are supplied through resistance 24 to the base of emitter follower transistor Q11. A radio frequency bypass condenser 25 couples the base of Q11 to ground. The collector of Q11 is grounded and its emitter, from which the output signal is derived, is coupled to the base of transistor Q9 of the differential pair of Q9, Q10.

The base of Q10 is not directly coupled to the input source, but as will be seen, is an input point for degenerative feedback. The emitters of Q9, Q10 are joined and receive their current through the collector of current source transistor Q16. Q16 has its emitter led through a 3000 ohm resistor 48 to the positive source of bias potentials 12. Audio signals directly amplified from the detector thus appear at the collector of Q9. As will be seen, signal components injected by the feedback loop also appear at the collector of Q9.

A second input to the differential amplifier Q9, Q10 is a feedback connection made from the amplifier output to Q12. Q12 is an NPN transistor in emitter follower configuration on what may be regarded as the degenerative side of the input differential amplifier. Output signals from the power amplifier are coupled from the output terminal 18, through resistance 27 to the base of Q12. The collector current of Q12 is supplied from the emitter of current source transistor Q17. The feedback signal appearing at the emitter of Q12 is fed to the base of Q10 of the differential pair. A resistance 26 coupled between the emitter of Q12 and ground is the signal load. The feedback signal so applied to the base of Q10 appears at the emitter of Q10, and is coupled from the emitter of Q10 to the emitter of Q9. At the collector of Q9, the feedback adds degeneratively to the initial input signal.

A directly amplified feedback signal also appears at the collector of Q10 and is coupled via a current "turnaround" into the output of Q9, where it enters the forward gain path of the amplifier. The current turnaround comprises transistors Q14 and Q15. The collector of Q10 is coupled to the base-collector connection of diode connected transistor Q15 on the input side of the turn-around. The emitter of Q15 is grounded. The junction of Q15 is paralleled with the input junction of Q14; the base of Q14 being coupled to the collector-base of Q15, and the emitter of Q14 being grounded. Thus, a current replicating that flowing in Q10 from the feedback source appears at the collector of Q14, and is also added to the signal appearing at the collector of Q9. The effect is to further augment the degenerative action.

A composite audio signal, including both the direct and the feedback signals from the two paths outlined, thus appears at the collector of Q9 and is applied to the base of output emitter follower Q13. The collector of Q13 is grounded and its emitter current is supplied from the collector of another current source, transistor Q19. Q19 has its emitter coupled to the B+ source through a resistance 37, and its base coupled to a bus common to the base of current source Q16, the emitter of Q17, and the base of current source Q18 (so far not described). The output signal appearing at the emitter of Q13 is coupled to the base of driver transistor Q1. Driver transistor Q1 drives the output push-pull amplifiers Q2, Q3 in the manner already described.

The differential input amplifier operates at a very high impedance level and employs a substrate PNP and a laterally formed PNP transistor in a Darling configuration. The stage is therefore of intrinsically high gain and can accept substantial amounts of degenerative feedback. The circuit values indicated provide for stable amplification.

The feedback connection completed from the output power amplifier to the input pre-amplifier supplements the feedback connections earlier noted in the power amplifier and improves the linearity of audio amplification to a fraction of a per cent. The d.c. balance, and in particular the idling voltage and the magnitude of the a.c. signal swings is set by means of resistance 27, transistor Q20, current source transistor Q7, tapped resistance 29, diodes D1-D2 and current source Q18 and zener diode CR1 and diode D5. By these means, the voltages (at the output point 18) is set at a desired voltage, normally, slightly below the half-way point between the positive potential of source 12 and ground. This is achieved by making resistance 27 equal to approximately one-half the value of resistance 29, by control of the current in constant current source Q18, and finally by action of the zener diode CR1.

The idling voltage (V18) at the output point of the amplifier may be calculated as follows. The collector of Q20 may be regarded as connected to a current node (point 31). Regarded as a current node, the sum of the currents toward and away from the node equal zero. More particularly, the current drawn away from the node of the collector of Q20, the current approaching the node through resistance 27 from the output point 18 of the amplifier, and the current approaching the node from the emitter of constant current source transistor Q18 may be equated as follows:

$$I_{c_{20}} = I_{c_{18}} + I_f \tag{1}$$

where $I_{c_{20}}$ = collector current from reference Q20,
$I_{c_{18}}$ = collector current from source Q18, and
$I_f$ = current in feedback resistance 27.

Increasing the current flow in the feedback resistance raises the idling voltage. Since that current is supplied from the collector current in Q20, increasing the collector current in Q20 has a like affect upon the idling voltage (V18).

The current at the collector of Q20 replicates the current in the serially connected diode D1, which flows under the influence of B+ less three diode drops (input junction of Q7, D1, D2) through the resistance 29 of 7.5K. When the zener diode CR1 is not in operation:

$$I_{c_{20}} = (B+ - 3\ Vd)/7.5K \tag{2}$$

When the zener diode CR1 is in operation, the current in the serially connected diode D1 is additionally influenced by the presence of CR1, whose cathode is coupled to a tap on resistance 29. The tap is set up 3.6K ohms from the terminal of resistance 29 toward ground and 3.4K ohms from the terminal of resistance 29 toward B+.

$$I_{c_{20}} = (V_Z - V_D)/3.6K \tag{2}$$

The current in Q18 is determined by the voltage across resistance 30 and the magnitude of that resistance. The voltage drop in resistance 30 is equal to the drop across diode D3, which is forward biased, and the input junction to Q17, less the voltage drop across the input junction Q18. Since diode D3 is forward biased with a small current, its drop is lowered slightly to approximately one-half volt. The current in Q18, assuming a voltage drop of 0.5 volts across emitter resistance 30, $$I_{c_{18}} = 0.5/3.3K \tag{3}$$

The current in the feedback resistance 27 is a function of the voltage (V18) at the amplifier output, the voltage at the node (31), and inversely proportional to feedback resistance 27. The voltage at the node 31 is the result of successive input junction drops "Vd" (Q11, Q9, Q10, Q12), commencing from the grounded terminal of potentiometer 24. The polarity of the voltage drops in the input junctions are successively positive for Q11, positive for Q9, negative for Q10, positive for Q12, leaving a net of two positive junction drops, and a value of 1.2 volts (approximately). Therefore, $I_f$ may be calculated as follows, assuming the zener to be inoperative.

$$I_f = (V_{18} - 1.2)/3.9K \quad (4)$$

Substituting into equation (1)

$$I_f = I_{c_{20}} - I_{c_{18}} \quad (5)$$

$$= (B+ - 3Vd)/7.5K - 0.5/3.3K \quad (6)$$

Solving for V18 by setting equation (4) equal to equation (6):

$$\frac{V_{18} - 1.2}{3.9K} = \frac{B+ - 3Vd}{7.5K} - \frac{0.5}{3.3K} \quad (7)$$

to obtain V18 (assuming the zener to be inoperative):

$$V_{18} = 3.9K \left( \frac{B+ - 3Vd}{7.5K} - \frac{0.5}{3.3K} \right) + 1.2 \quad (8)$$

Assuming the zener diode to be operating, V18 becomes:

$$V_{18} = \frac{R_{27}}{R''_{41}} (V_Z - V_D) - R_{27}I_{c_{18}} + 1.2 \quad (8')$$

$$= \frac{3.9K}{3.6K} (6.0 - 0.7) - \frac{0.5}{3.3K} (3.9K) = 1.2$$

$$V_{18} = 6.35 \text{ volts}$$

The preferred value for V18 is set slightly below half the d.c. voltage because the emitter saturating characteristic of lower push-pull transistor Q3 is not symmetrical with the collector saturating characteristic of transistors Q2 and Q8/ For operation below the zener point, the push-pull output stages operate class B. When the zener diode is in operation, then depending upon the amount of current added to the normal idling current of the push-pull output stages, they shift from a class B to a class A mode of amplification. This shift decreases the power efficiency of the amplifier, but produces a marked improvement in fidelity and a substantial reduction in crossover distortion.

In addition to providing an accurate control of the centering of the push-pull output amplifier, the configuration of FIG. 2 also provides both appreciable hum suppression and substantial d.c. stability. These last two measures are achieved in a particularly economic fashion. As shown in FIG. 2, the collector of Q20 at node 31 is coupled to an external pad 35, to which a capacitor 34 is attached. This capacitor has a large value (47 - 200µf) at a low voltage (2.5 volts). This value provides a low impedance at 60 cycles and provides appreciable hum suppression. The addition of the zener diode further improves the inherent hum rejection because the zener not only establishes the B+ voltage, but also serves to regulate the centering current in Q20. This later feature serves to attenuate the hum component in the collector of Q47 and is in addition to the hum rejection established by the capacitance 34. This improves the inherent hum rejection of the amplifier as much as 15 $dB$ at lower sound levels. For example, with a B+ capacitor 42 of 200µf and a capacitor 34 of 47µf, the zener regulated amplifier at a 50 MW signal shows an improvement in signal to hum ratio of 16 dB over the same amplifier without the zener.

As previously noted, if one wishes to maximize the voltage regulation, the regulator dynamic impedance should be set at its lowest value of 3 ohms. However, when the total arrangement is integrated into a single integrated circuit a dynamic impedance closer to 30 ohms may be preferable. Lowering the dynamic impedance does reduce the B+ ripple voltage and does improve amplifier hum rejection. It also puts a tighter control on the value of the regulated B+ voltage. The disadvantage is that the ripple currents are increased significantly, thereby setting up higher temperature gradients within the IC. These thermal gradients may increase hum coupling to the detector and degrade the signal to hum ratio at lower sound levels.

The foregoing regulator produces a B+ voltage which may be calculated by an iterative solution of the following equations:

$$R'_{47} \left[ \frac{B+ - V_Z - 2V_D}{R_{29'}} - \frac{V_Z - V_D}{R_{29''}} \right] = \frac{KT}{q} \ln \frac{(I_{B+})}{P_A I_{CS}} - \frac{I_{CS} R_{14}}{\beta NPN} \quad (9)$$

$$I_{CS4} = \left( \frac{K_m}{\beta_6} \right) \left( \frac{B+ - V_Z - 2V_D}{R_{29'}} + I_{C17} \right) + \frac{V_{BE/Q6}}{R_{15}}$$

Where the parameters not on the circuit diagram are:
 $V_Z$ = Zener voltage of CR1
 $V_D$ = Forward diode drop of diodes D1, D2, D5
 $K_M$ = Multiplication factor of Q7, Q8 attributable to their areas and emitter resistances
 $P_A$ = Area ratio between $Q_5$ and $Q_3$
 $I_{B+}$ = Represents that portion of the total supply current that must be absorbed by the audio output. That is, the difference between what the rest of the IC requires and the amount supplied from the B+ current source.

A component variational analysis based on these equations predicts that the B+ voltage should fall in the range of 12 to 14.5 VDC and agrees with experimental data. In the zener mode, the supply current is typically set at 42 Ma. Part of this current, approximately 15 Ma, is required by the radio portions of the circuit. The remaining portion, 27 Ma, is absorbed by the audio output and is defined as $I_{B+}$. The $I_{B+}$ quiescent value can vary from 20 Ma to 35 Ma depending on current requirements in the other portions of the IC.

What is claimed as new and desired to be secured by Letters Patent of the United States is:

1. Electronic apparatus comprising:
   A. a source of bias voltage having two output terminals, one common, said source having appreciable internal resistance and requiring voltage regulation,
   B. a push-pull audio output stage comprising: a first and a second output transistor of a first conductivity type, each connected in a base input configuration with the collector of said first output transistor being connected to the non-common terminal of said source, the emitter of said first output transistor being coupled to the collector of said second transistor, and the emitter of said second output transistor being returned to said common terminal, said output transistors having sufficient current capacity for shunt regulation of said source, the audio output of said output transistors being taken at their interconnection, C. a driver stage for said push-pull output stage, comprising:
1. a third transistor of said first conductivity type for driving both output transistors, connected in base input, emitter-follower configuration, the emitter of said third transistor being d.c. coupled to the base of said second output transistor,
2. a phase inverting intermediate driver for coupling the output from the emitter of said third transistor to the base of said first output transistor and comprising a fourth transistor,
   a. said fourth transistor being of said first conductivity type and having its base d.c. coupled to the emitter of said third transistor through a first resistance and the emitter common to parallel the input junctions of said fourth and second transitors to stabilize their current ratio, and D. output voltage regulating means coupled between said source output terminals comprising:
1. a voltage reference for sensing a deviation in bias voltage from a desired value,
2. means for producing an error current in response to said deviation, and
3. means for applying said error current to said first resistance to cause a change in base-emitter voltage in said second output transistor in response to said bias voltage, said change in base-emitter voltage altering said current ratio and changing the idling current of said second output transistor; and by virtue of said interconnection to the emitter of said first output transistor causing a corresponding change in idling current in said first output transistor, said idling current changes in said output transistors being in a sense to provide shunt regulation of said bias voltage.

2. Electronic apparatus as set forth in claim 1 wherein:
A. a constant current source is provided having its input coupled to said non-common terminal and its output coupled to the base of said first output transistor for control of its idling current, and wherein
B. said intermediate driver comprises a fifth transistor of a second conductivity type, having its collector coupled to said output interconnection, its base electrode coupled to the collector of said fourth transistor and having its emitter coupled to the output of said constant current source.

3. Electronic apparatus as set forth in claim 2 wherein means are provided for stabilizing the d.c. idling voltage of said audio output interconnection, said means including:
a. a second resistance having one end coupled to a point which is of substantially fixed voltage with respect to said common terminal and the other end coupled to said output interconnection, and
b. means coupled between said source output terminals to control the voltage of said audio output interconnection comprising a controlled current source responsible to said bias voltage and adjusted to withdraw current from said second resistance for holding said d.c. idling voltage at approximately half said bias voltage.

4. Electronic apparatus as set forth in claim 3 wherein
a. the voltage reference of said output voltage regulating means comprises a zener diode, and wherein
b. said error current producing means comprises an impedance serially connected with said zener diode between said source output terminals in which a current is produced when an increase in output voltage causes said zener voltage to be exceeded, and wherein
c. said error current applying means comprises a sixth transistor having its input junction shunting said series impedance, and having its collector connected to said first resistance to supply a current thereto dependent on that flowing in said series impedance.

5. Electronic apparatus as set forth in claim 4 wherein said series impedance is a diode connected in shunt with the input junction of said sixth transistor and in the same sense to make said supplied current dependent on the base-emitter area of said sixth transistor and the junction area of said diode.

6. Electronic apparatus as set forth in claim 5 wherein the transistors and diodes previously recited, are integrated in a common monolithic substrate.

* * * * *